United States Patent
Demharter et al.

(10) Patent No.: US 10,145,918 B2
(45) Date of Patent: Dec. 4, 2018

(54) EMISSION OF HIGH FREQUENCY PULSES IN A MAGNETIC RESONANCE TOMOGRAPHY SYSTEM

(71) Applicants: Nikolaus Demharter, Dormitz (DE); Klaus Huber, Effeltrich (DE); Claus Seisenberger, Neufrannhofen (DE); Thorsten Speckner, Erlangen (DE); Markus Vester, Nürnberg (DE); Christian Wünsch, Röthenbach a.d. Pegnitz (DE)

(72) Inventors: Nikolaus Demharter, Dormitz (DE); Klaus Huber, Effeltrich (DE); Claus Seisenberger, Neufrannhofen (DE); Thorsten Speckner, Erlangen (DE); Markus Vester, Nürnberg (DE); Christian Wünsch, Röthenbach a.d. Pegnitz (DE)

(73) Assignee: Siemens Aktiengesellschaft, München (DE)

( * ) Notice: Subject to any disclaimer, the term of this patent is extended or adjusted under 35 U.S.C. 154(b) by 1676 days.

(21) Appl. No.: 13/784,797

(22) Filed: Mar. 4, 2013

(65) Prior Publication Data
US 2013/0229180 A1 Sep. 5, 2013

(30) Foreign Application Priority Data
Mar. 5, 2012 (DE) .................. 10 2012 203 452

(51) Int. Cl.
*G01R 33/54* (2006.01)
*G01R 33/36* (2006.01)

(52) U.S. Cl.
CPC ....... *G01R 33/543* (2013.01); *G01R 33/3614* (2013.01)

(58) Field of Classification Search
CPC .. G01R 33/3607; G01R 33/54; G01R 33/543; G01R 33/5612; G01R 33/3614
USPC .................................. 324/307–309, 318–322
See application file for complete search history.

(56) References Cited

U.S. PATENT DOCUMENTS

| | | | | |
|---|---|---|---|---|
| 7,639,015 B2 * | 12/2009 | Thuringer | ..... | G01R 33/3614 324/318 |
| 2004/0263166 A1 | 12/2004 | Kluge | | |
| 2005/0197077 A1 * | 9/2005 | Bielmeier | ..... | H03G 3/3047 455/115.1 |

(Continued)

OTHER PUBLICATIONS

German Office Action dated Oct. 26, 2012 for corresponding German Patent Application No. DE 10 2012 203 452.8 with English translation.

*Primary Examiner* — Rishi Patel
(74) *Attorney, Agent, or Firm* — Lempia Summerfield Katz LLC

(57) ABSTRACT

A method for emitting a sequence of high frequency pulses that may have different envelopes in a magnetic resonance tomography system is provided. A digital instruction signal that specifies the envelope for the high frequency pulses that are to be emitted is received. A digital control signal is transmitted to a high frequency unit for generating high frequency pulses, depending on the instruction signal. A test signal that allows notification of a current overload situation is received. The current control signal is reduced if the test signal indicates an overload situation.

15 Claims, 5 Drawing Sheets

(56) References Cited

U.S. PATENT DOCUMENTS

| | | | |
|---|---|---|---|
| 2005/0260955 A1* | 11/2005 | Bielmeier | G01R 33/3614 455/115.1 |
| 2008/0157765 A1* | 7/2008 | Fontius | G01R 33/3415 324/309 |
| 2010/0312091 A1 | 12/2010 | Krueger et al. | |
| 2011/0026799 A1* | 2/2011 | Nehrke | G01R 33/246 382/131 |
| 2013/0200898 A1* | 8/2013 | Baumgartl | G01R 33/3607 324/322 |

* cited by examiner

EMISSION OF HIGH FREQUENCY PULSES IN A MAGNETIC RESONANCE TOMOGRAPHY SYSTEM

This application claims the benefit of DE 10 2012 203 452.8, filed on Mar. 5, 2012, which is hereby incorporated by reference.

BACKGROUND

The present embodiments relate to emitting a sequence of high frequency pulses that may have different envelopes, in a magnetic resonance tomography system.

In order to generate an image with the aid of a magnetic resonance tomography method, defined high frequency pulses are to be emitted into the patient's body or into the part of the body that is to be investigated that is located in a precisely defined magnetic field. This stimulates the nuclear spins of the atoms in the object that is being investigated. The signals from the nuclear spin that have been emitted in sequence are captured and acquired as raw data, from which the desired magnetic resonance images may be generated. In general, a very wide range of sequences of high frequency pulses are emitted for various investigations, each individual high frequency pulse having a precisely defined duration, amplitude and shape in order to achieve a certain effect. The parameters used for this purpose are set in the form of a digital data stream that is mixed at a mixed frequency MF so that in total, the high frequency signal that has been modulated in the desired manner (e.g., the desired series of high frequency pulses) is generated.

High frequency signals vary depending on the load. The load may generate a complex reflection coefficient (e.g., part of the power output from the amplifier is reflected and phase-reversed). In a magnetic resonance tomography system, the load depends on each patient being investigated and on each part of the body investigated. Therefore, before the start of an investigation, pulses known as "adjustment pulses" are transmitted, with which the power output used for each investigation situation is determined in advance.

A movement on the part of the patient during the investigation may lead to a change in the load situation, however. The performance of some components during the duration of the investigation may vary due to temperature effects.

Carrying out a regulation of the amplitude and of the phase of the high frequency signal even during the investigation is therefore already known. This may involve taking into account both the signal from the amplifier to the load and the reflected signal.

In magnetic resonance tomography systems, the high frequency power amplifiers (e.g., RFPAs or radio frequency power amplifiers) incorporated therein, with which the high frequency transmission pulses are generated, are critical components. They may be used up to a power limit and may sustain damage permanently even when there is only a short-term overload.

Attempts may be made to avoid overload situations by using additional adjustment pulses that check the overload limit. Magnetic resonance tomography systems may also be fitted with overload detectors that detect a potentially damaging overload situation and trigger the aborting of the sequence. This provides, however, that the prescribed sequence of precisely defined high frequency pulses for an investigation is aborted. A new adjustment is then carried out using adjustment pulses. For the patient, the duration of the investigation is increased, and the equipment is taken up by an investigation for a longer period.

SUMMARY AND DESCRIPTION

The present embodiments may obviate one or more of the drawbacks or limitations in the related art. For example, a method and a circuit arrangement, with which an overload during a pulse sequence is avoided without the sequence being terminated, are provided.

In the method, for the emission of a sequence of high frequency pulses, a digital instruction signal that specifies an envelope for the high frequency pulses to be emitted is first received. This involves an instruction signal being created using a digital data stream that is converted into a sequence of high frequency pulses in a subsequent high frequency unit. The instruction signal may be provided by a central control unit in the magnetic resonance tomography system.

The field generated by the high-frequency pulses is also known as the $B_1$-field. The digital data stream may be standardized (e.g., normalized) so that the value of the absolute maximum standardized instruction amplitude is "1." At the start of an investigation on a new patient, or when the patient's position changes, an adjustment of the transmitting power is first carried out in order to adjust the $B_1$-field to the correct value. For this purpose, the transmitting power may be modified until, at a predetermined duration of the transmission pulses, a specific precisely measurable flip angle is created between the nuclear magnetization and the homogeneous basic magnetic field, through the influence of a high frequency pulse. In one embodiment, the calibration is carried out to a flip angle of 180°. From this adjustment, the maximum permissible and optionally standardized instruction amplitude emerges.

A digital control signal is emitted to a high frequency unit in order to generate the high frequency pulses depending on the instruction signal. In the simplest scenario, the control signal is identical to the instruction signal. However, the control signal may deviate from the instruction signal, for example, if a regulating procedure is taking place. In the method, the control signal deviates from the instruction signal if an overload situation is detected.

For this purpose, a test signal that provides an indication relating to a current overload situation is received. The test signal is received in digital form. The value measured may be a voltage or a current on a body coil, for example. In one embodiment, the current or voltage on a high frequency voltage amplifier output may be tested. Each system parameter that allows a direct indication of an overload situation may be measured.

A system parameter that may also be considered is signal strength in the outward and/or return direction. In one embodiment, a directional coupler may be provided at the output end of the high frequency amplifier. With this coupler, part of the high frequency signal (e.g., part of the pulse sequence) may be decoupled in the direction of an antenna arrangement. The antenna arrangement may be a body coil, for example, a local transmitter coil arrangement or a combination of the two. The directional coupler may also be used for part of the reflected signal to be decoupled.

From the forward power and the reflected power, the current load situation on the high frequency amplifier, for example, may be determined by transformation of the data if the system transmission properties are known.

Following a corresponding filtering, amplifying and analog-digital conversion known to a person skilled in the art, the signals are available in the form of digital test signals for use in the method.

The testing ensues continuously (e.g., without any interruption or at very short intervals). Any overload situation that is occurring may therefore be recognized in real time.

The current control signal is reduced if the test signal indicates an overload situation. The reduction that may be necessary likewise occurs continuously. As is known to a person skilled in the art, in a digital signal processing system, a pulse is composed of a plurality of digital data points. In order to allow a rapid reduction, the pulse is sampled at a high sampling rate. In this context, a high sampling rate provides that during the pulse, at least thousands if not a million test signals are received, and a reduction may be carried out. An overload may thus be avoided in real time.

A reduction in the current control signal therefore provides that a reduction occurs while a pulse is actually being sent. The exceeding of an overload limit is immediately prevented, and there is no overload on components.

A corresponding circuit arrangement includes a receiver unit to receive a digital instruction signal that prescribes the envelope of the high frequency pulses that are to be emitted. The receiver unit includes a signal input for the instruction signal.

The circuit arrangement further includes an output unit in order to emit a digital control signal to a high frequency unit so that high frequency pulses may be generated depending on the instruction signal. The output unit includes a signal output for the control signal.

The circuit arrangement further includes a test receiver to receive a test signal that allows notification of a current overload situation. The test receiver includes a signal input for the test signal.

The circuit arrangement further includes a correction unit to reduce the current control signal if the test signal indicates an overload situation. The correction unit receives the instruction signal from the receiver unit, and from the test receiver, the correction unit receives information relating to the overload situation. The correction unit transmits a corrected control signal to the output unit.

The circuit arrangement may be configured as a field-programmable gate array (FPGA). This allows rapid signal processing.

Further advantageous embodiments and developments are set forth in the description that follows. The description within a category may also be further developed as with the description for a different category.

A standardized overload factor may be calculated from the test signal by dividing the test signal by a test value, at the exceeding of which an overload occurs. This standardization has the result that a value of "1" is assigned to the level at which an overload limit has been reached. A reduction of the current control signal is performed if the standardized overload factor exceeds the value of "1". Standardization has the advantage of rapid signal processing since the closely restricted range of values provides that it is possible to work with fixed-point arithmetic.

In a development, the reduction in the current control signal is achieved by the current instruction signal being divided by the current standardized overload factor. By the standardization of the overload factor to the limiting value, division has the effect that, precisely, the instruction signal that has been reduced in this way reaches the limiting value.

In one embodiment, a maximum value is determined for the overload factor via at least the first pulse. The information thus obtained may be evaluated in the central control unit, for example. The information indicates by how much the load limit has been maximally exceeded.

In an advantageous development, the maximum permissible instruction amplitude for a subsequent pulse is reduced if the specified maximum value for the overload factor is greater than "1". The reduction of the current amplitude to the limiting value in accordance with the method reliably protects the components against overload but leads to a spectral distortion of the pulse. According to the development, the distortion is counteracted for subsequent pulses by the maximum permissible instruction amplitude being reduced for one or for all subsequent pulses. This leads to a scaling of the subsequent pulses, and the amplitudes thereof may be reduced without any distortion occurring.

In one embodiment, the maximum permissible instruction amplitude is determined for the subsequent pulse by dividing the maximum permissible instruction amplitude by the specific maximum value for the overload factor. Where the load situation remains unchanged (e.g., if the patient has moved once such that an overload situation was brought about but has since remained lying still in the new position or if the overload situation has been brought about by a certain operating temperature being reached), a recurrence of the overload may be avoided by the scaling.

In one embodiment, scaling factors for possible specified overload factors may be stored in a table. The reduction of the current instruction amplitude is achieved by the instruction amplitude for the current standardized overload factor being multiplied by the appropriate scaling factor. A scaling factor of "1" may correspond to a standardized overload factor of "1". Digital multiplication uses fewer calculations than digital division. The signal processing may be sped up by storing scaling factors in a table. The scaling factor for a specified overload factor may be the reciprocal of the overload factor.

Advantageously, a minimum scaling factor is determined via at least the first pulse. This minimum scaling factor may be used to calculate the maximum overload factor reached. This value may be made available to a superordinated system control.

In a development, the maximum permissible instruction amplitude for a subsequent pulse may be reduced if the minimum specified scaling factor is lower than "1".

The maximum permissible instruction amplitude for the subsequent pulse may be determined by multiplying the maximum permissible instruction amplitude by the specified scaling factor. The distortion is counteracted for subsequent pulses. The maximum permissible instruction amplitude for one or even for all subsequent pulses is reduced. This leads to a scaling of the subsequent pulses, and the amplitudes thereof may be reduced without this leading to a spectral distortion.

In one embodiment, the method is combined with a method for regulating a high frequency signal in a magnetic resonance tomography system. Precisely during the regulating of a high frequency signal, an overload situation may occur if the control loop is attempting to compensate for an increased attenuation in the high frequency circuit. Such an attenuation may be caused, for example, by a movement on the part of the patient. Advantageously, the reduction of the maximum permissible instruction amplitude is compensated for at another point in the control loop in order to keep the regulation stable.

In one embodiment, a feedback signal in the control loop is conversely increased in proportion to the reduction in the maximum permissible instruction amplitude.

In an alternative embodiment, a controller input signal is reduced in proportion to the reduction in the maximum permissible instruction amplitude.

Both embodiments have in common the fact that, as a result of the compensation, the regulating process does not counteract the reduction.

The circuit arrangement may be located in a magnetic resonance tomography system. Changes in the load during an investigation due, for example, to a movement on the part of the patient or to temperature effects in the high frequency unit or, more generally, in the entire high frequency section may lead to the sequence being aborted. The patient then goes through a completely new investigation. Using the method or the circuit arrangement, aborting of the sequence is avoided.

BRIEF DESCRIPTION OF THE DRAWINGS

Identical reference signs are used to denote the same components.

DETAILED DESCRIPTION

Figure 1:
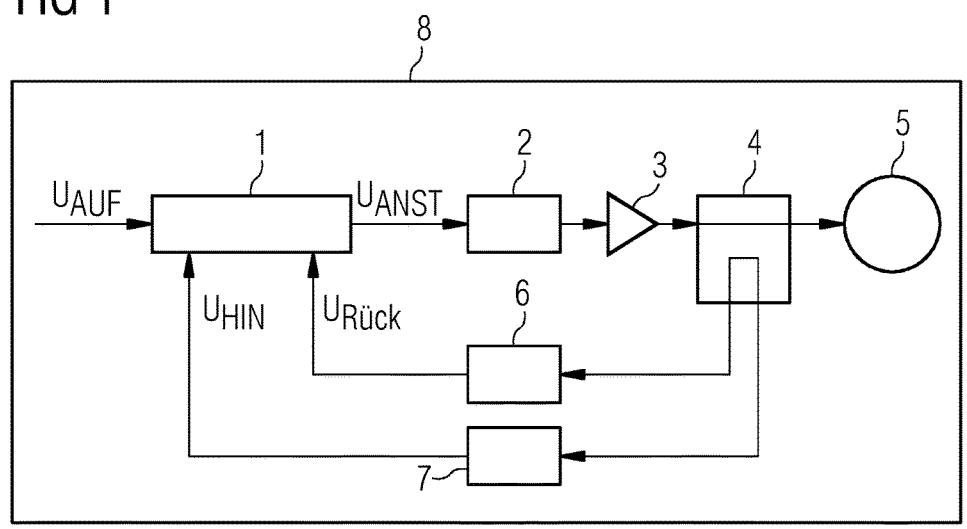
FIG. 1 is a schematic block diagram of one embodiment of a magnetic resonance tomography system.

FIG. 1 illustrates a schematic block diagram of a magnetic resonance tomography system 8, in which one embodiment of a circuit arrangement 1 is used. Only some of the parts of the magnetic resonance tomography system 8 are shown in FIG. 1.

FIG. 1 illustrates a block 1 that contains one embodiment of a digital circuit arrangement, a digital-to-analog converter 2 including a mixer, a high frequency amplifier 3, a directional coupler 4 and an antenna arrangement 5. Via the directional coupler 4, a portion of a signal routed toward the antenna arrangement is extracted and routed to an analog-to-digital converter 7, in which a demodulation is also performed. In addition, via the directional coupler 4, a portion of the signal that is reflected by the antenna arrangement is extracted and routed to an analog-to-digital converter 6, in which a demodulation is also performed. Outputs of the transducers 6 and 7 are connected to the circuit arrangement 1. The transducer 6 delivers a voltage $U_{R\"uck}$ (U back), and the converter 7 delivers a voltage $U_{Hin}$ (U forward) to the circuit arrangement 1.

The circuit arrangement 1 receives an instruction voltage $U_{AUF}$ (U instruction) or, more generally, a digital instruction signal that specifies an envelope for a desired pulse sequence. The circuit arrangement 1 delivers a control voltage $U_{ANST}$ (U control) or, more generally, a digital control signal to the high frequency unit or section that includes the transducer 2, the high frequency amplifier 3, the directional coupler 4 and the antenna arrangement 5. If there is no threat of an overload situation, and if no regulating has been scheduled, then in the simplest scenario, the control voltage $U_{ANST}$ is equal to the instruction voltage $U_{AUF}$.

The antenna arrangement 5 is located in a scanner in the magnetic resonance tomography system 8. A patient or test subject may be positioned in the scanner in a test area (e.g., a "tunnel") for an investigation. This scanner includes, for example, a basic magnetic field system in order to apply a basic magnetic field in the test area, and also includes a gradient coil system, via which a pulse sequence of magnetic field gradient pulses may be emitted according to a prescribed test protocol. High frequency pulses may be emitted via the antenna arrangement 5 to excite nuclear spins in an area of the test subject that is to be investigated. The antenna arrangement 5 may be a body coil, for example, as shown in FIG. 1, or a local transmitter coil arrangement. The antenna arrangement may also capture the magnetic resonance signals generated as a result of the relaxation of the nuclear spins that have been excited. Various antenna arrangements may be used for one investigation (e.g., a body coil to transmit the high frequency pulses and local coils to capture the magnetic resonance signals). The various partial systems or components are controlled by a control device in the magnetic resonance tomography system 8, which, for example, may also specify the instruction voltage $U_{AUF}$ for the high frequency pulses. The control device further includes a magnetic resonance signal-receiver that receives the magnetic resonance signals from the antenna arrangement used for the reception thereof as raw data, processes the magnetic resonance signals, and passes the magnetic resonance signals on to a reconstruction unit that reconstructs the image data using the raw data as a basis. In one embodiment, a terminal may be connected to the control device. An operator may operate the control device and hence the entire magnetic resonance tomography system 8 via the terminal. These components are known to a person skilled in the art, however, just as is the basic mode of operation of a magnetic resonance tomography system. These components are therefore not shown in more detail in FIG. 1.

Figure 2:
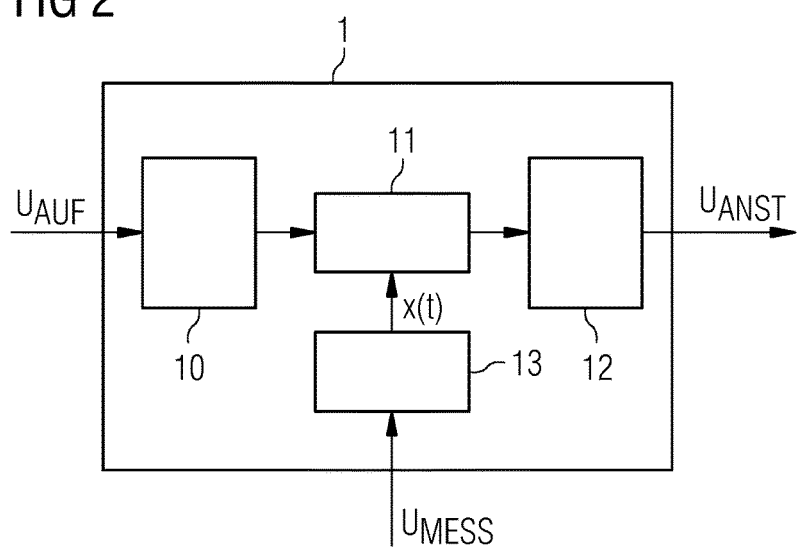
FIG. 2 is a schematic block diagram of one embodiment of a circuit arrangement.

FIG. 2 illustrates one embodiment of the circuit arrangement 1 in more detail in a schematic block diagram. The circuit arrangement 1 may be configured as a field-programmable gate array (FPGA). In order to achieve rapid signal processing, fixed-point arithmetic may be used. The individual blocks are function blocks within the logic circuit. The circuit arrangement 1 includes a receiver unit 10, an output unit 12, a test receiver 13 and a correction unit 11. The instruction voltage $U_{AUF}$ is received by the receiver unit 10 and forwarded to the correction unit 11. The correction unit 11 receives a current standardized overload factor x(t) from the test receiver 13 and forwards the signal received by the receiver unit 10, corrected where necessary, to the output unit 12. The output unit 12 emits the control voltage $U_{ANST}$ to the subsequent high frequency section.

The test receiver 13 receives a test voltage or, more generally, a test signal $U_{MESS}$. Only one test signal is shown in FIG. 2, where two signals, $U_{R\"uck}$ and $U_{Hin}$, are shown in FIG. 1. In the functioning of the circuit arrangement, a continuously monitored system parameter that allows notification of an overload situation is supplied. A current load situation in the high frequency amplifier may thus be determined by transformation from, for example, the forward power and the reflected power if the system transmission properties are known. A meaningful test signal may be provided either outside or inside the circuit arrangement 1. Thus, two test signals may be supplied, as in FIG. 1, or, as in FIG. 2, a test signal that has already been processed may be supplied.

In one embodiment, a standardization of the test signal to a test value that forms the overload limit is performed in the test receiver 13, such that values greater than "1" signify an overload situation. The standardized overload factor $x(t)$ thus produced is transmitted to the correction unit 11. If the standardized overload factor $x(t)$ is greater than "1", then a correction is performed in order to preclude the risk of an overload.

In one embodiment, a division process is incorporated in the logic circuit 1 such that the current instruction voltage is divided by the standardized overload factor $x(t)$ if this factor is greater than "1."

In another embodiment, a table with scaling factors is stored in the logic circuit 1. The scaling factors are assigned in each case to specific overload factors. The scaling factor assigned may be the reciprocal $1/x(t)$ of the overload factor $x(t)$. The configuration with a table is advantageous since multiplication of the current instruction voltage by the corresponding scaling factor is subsequently performed, which is faster.

One embodiment of the method is explained below with reference to FIG. 3. The flow chart begins in act 20 with the initialization known in the prior art. Adjustment pulses, with which the permissible maximum amplitude $ua_{max}$ of the instruction voltage is determined for the current investigation of a patient, are emitted. In act 21, which is likewise known from the prior art, a check is carried out as to whether the standardized instruction voltage ua (e.g., a maximum amplitude of the envelope for the current pulse) is greater than the permissible maximum amplitude $ua_{max}$. If this is the case, then in act 22, the standardized instruction voltage ua is raised to the permissible maximum amplitude $ua_{max}$. "Scaling" may be that the entire pulse is reduced. If the standardized instruction voltage ua does not exceed the permissible maximum amplitude $ua_{max}$, then according to act 23, the original envelope of the current pulse remains unchanged.

In act 24, a maximum for the standardized overload factor $Max(x(t))$ is set at the value "1". Subsequent to this, the pulse is started in act 25.

A test signal that depicts a system parameter that indicates an overload situation is received constantly. This test signal is used to determine the current standardized overload factor $x(t)$. In act 26, a check is carried out as to whether the current standardized overload factor $x(t)$ exceeds the value "1." If this is the case, then in act 27, the current control signal $U_{ANST}(t)$ is determined by the current instruction signal $U_{AUF}(t)$ being divided by the current value for the standardized overload factor $x(t)$. The current value for the standardized overload factor $x(t)$ is stored as the new maximum for the standardized overload factor.

If the current standardized overload factor $x(t)$ does not exceed the value "1," then in act 28, the current control signal $U_{ANST}(t)$ remains equal to the current instruction signal $U_{AUF}(t)$. In a scenario where the method is used in conjunction with a regulating process, then the output signal from the regulator remains unchanged accordingly.

In act 29, a check is carried out as to whether the end of the current pulse has been reached. If this is not the case, then the method acts are repeated from act 26 onwards until the end of the pulse.

After the end of the pulse has been reached, a check is carried out in act 30 as to whether the end of the current sequence has been reached. An investigation includes a predetermined succession of pulses (e.g., a "sequence"). If the end of the sequence has not been reached, then in act 31, a check is carried out as to whether the maximum for the standardized overload factor $Max(x(t))$ is greater than "1." If the overload limit has not been exceeded in the preceding pulse, then $Max(x(t))$ is not greater than "1," and the method is continued with act 21 (e.g., with the scaling of the next pulse depending on the result for the initial adjustment pulses).

If the overload limit has been exceeded (e.g., if the maximum for the standardized overload factor $Max(x(t))$ is greater than "1"), then in act 32, the permissible maximum amplitude $ua_{max}$ is reduced by the permissible maximum amplitude $ua_{max}$ being divided by the maximum for the standardized overload factor $Max(x(t))$. The method is subsequently continued with act 21 (e.g., with the scaling of the next pulse), the newly calculated permissible maximum amplitude $ua_{max}$ being used.

Figure 3:
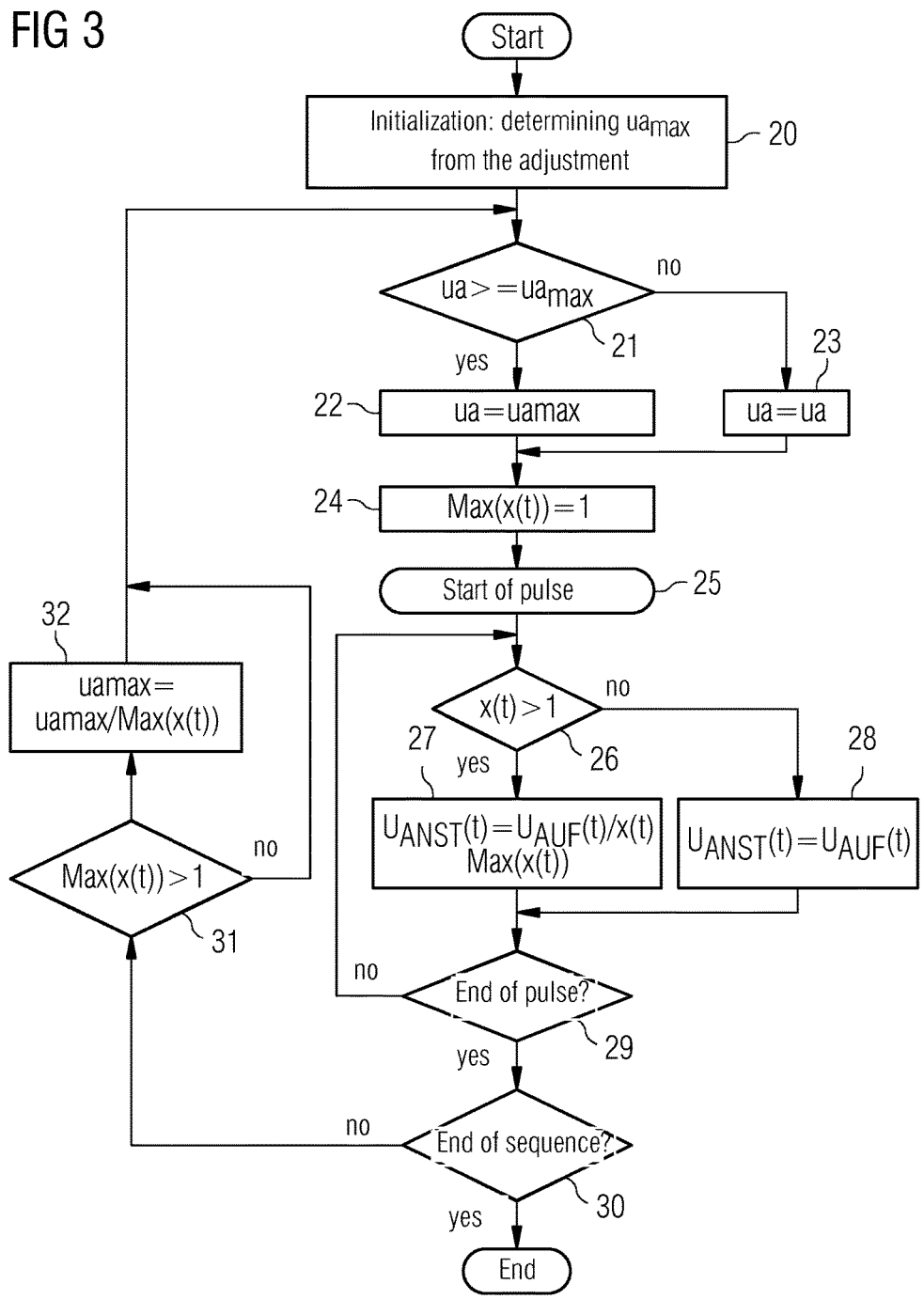
FIG. 3 is a flow chart for one embodiment of a method.

In the exemplary embodiment according to FIG. 3, the maximum for the standardized overload factor $Max(x(t))$ is reset to the value "1" at the beginning of a new pulse.

Figure 4:
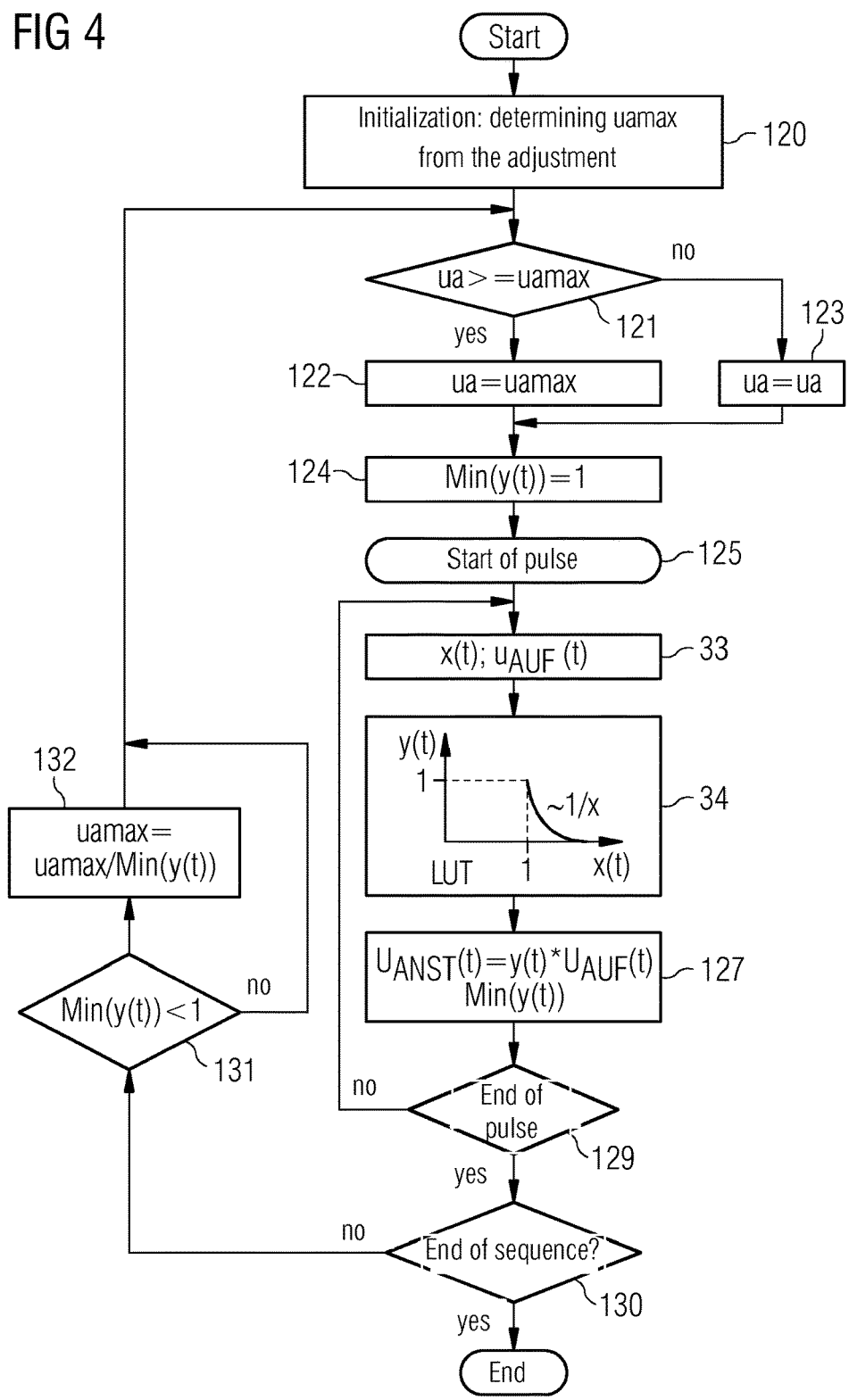
FIG. 4 is a flow chart for another embodiment of the method.

In a further flow chart, FIG. 4 illustrates another embodiment of the method. Method acts that correspond to a method act according to the flow chart of FIG. 3 have been denoted with a reference sign numbered by adding "100" to the reference sign used in FIG. 3 and are not explained again in closer detail. Acts 120 to 125 denote the initialization by adjustment pulses, the scaling of the pulses where necessary, and the beginning of a pulse. Act 124 in the flow diagram in FIG. 4 differs from act 24 in the flow diagram in FIG. 3 insofar as it is not a maximum of the standardized overload factor $Max(x(t))$ that is set at the value "1," but a minimum of the scaling factor $Min(y(t))$.

In act 33, the current value for the standardized overload factor $x(t)$ and the current instruction signal $U_{AUF}(t)$ are received. In act 34, a query is raised in a Lookup Table LUT as to which scaling factor $y(t)$ corresponds to the current overload factor $x(t)$. Act 34 illustrates a possible connection in graph form. For a value of $x(t)$ lower than or equal to "1," the value of $y(t)$ is constantly "1." For values of $x(t)$ greater than "1," the value of $y(t)$ is proportional to $1/x(t)$. The advantage of this exemplary embodiment manifests in act step 127. The current control signal $U_{ANST}(t)$ is determined by multiplying the current instruction signal $U_{AUF}(t)$ by the current value for the scaling factor $y(t)$. A multiplication is achievable digitally in fewer steps than are used for a division such as provided in act 27 in the flow diagram according to FIG. 3. Fewer calculations provide that the signal processing is sped up. Raising queries, as in act 26 in FIG. 3, is not provided. Since the scaling factor $y(t)$ for values of $x(t)$ lower than or equal to "1" is constantly set at the value "1," multiplication may be carried out at any time.

In act 127, the current value for the minimum scaling factor is also stored in the memory.

In act 129, a check is made as to whether the end of the current pulse has been reached. If this is not the case, then the acts are repeated from act 33 until the end of the pulse.

After reaching the end of the pulse, a check is carried out in act 130 as to whether the end of the current sequence has been reached. If the end of the sequence has not been reached, a check is carried out in act 131 as to whether the minimum for the scaling factor is "1." If an exceeding of the overload limit has not occurred in the previous pulse, then $Min(y(t))$ is not lower than "1," and the method is continued with act 121 (e.g., scaling of the next pulse depending on the result for the initial adjustment pulses).

If the overload limit has been exceeded (e.g., if the minimum for the scaling factor Min(y(t)) is lower than "1"), then in act 132, the permissible maximum amplitude $ua_{max}$ is reduced by multiplying this amplitude by the minimum scaling factor Min(y(t)). The method is subsequently continued with act 121 (e.g., scaling of the next pulse), using the freshly calculated maximum amplitude $ua_{max}$.

Figure 5:
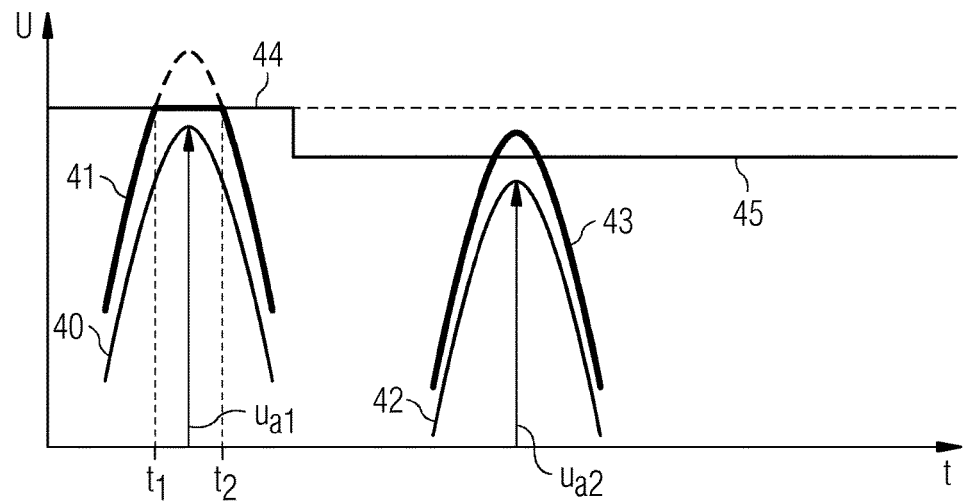
FIG. 5 is an exemplary voltage time diagram used to explain pulse changes for a first pulse sequence.
Figure 6:
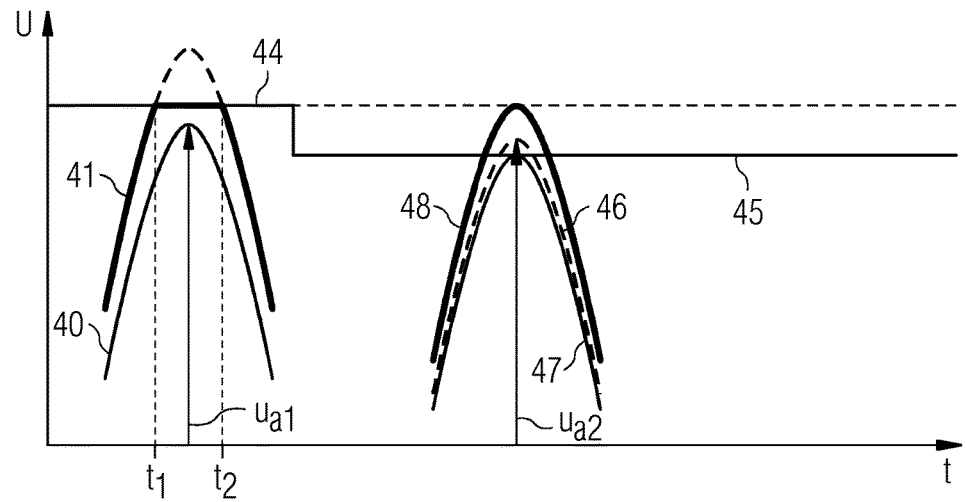
FIG. 6 is a voltage time diagram used to explain the pulse changes for a second pulse sequence.

The effects of the method on the pulses that have been generated are explained in more detail hereafter with reference to FIGS. 5 and 6.

FIG. 5 illustrates a voltage/time diagram in which a voltage U is recorded across a time axis t (shown in arbitrary units in each case). The figure illustrates a voltage curve 40 for an instruction voltage $U_{AUF}$ for a first pulse and a voltage curve 42 for an instruction voltage $U_{AUF}$ for a second pulse. For the first pulse, a permissible maximum amplitude $ua_{max}$ 44 was determined. The instruction voltage $U_{AUF}$ 40 has a maximum amplitude $ua_1$ that is lower than the maximum amplitude $ua_{max}$ 44, so the instruction voltage therefore remains unchanged. No scaling is performed. Due to load changes that have occurred via the adjustment pulses after initialization, the actual voltage 41 in the high frequency amplifier would exceed the permissible maximum amplitude $ua_{max}$ 44 between the times $t_1$ and $t_2$, which is indicated by a dotted line on the curve 41. From the time $t_1$ onwards, the continuously determined overload factor x(t) is therefore above the value "1". The current instruction voltage is divided by the current overload factor, such that control of the high frequency unit is performed using a control voltage that is lower than the instruction voltage. The consequence is that the voltage 41 in the high frequency amplifier is reduced to the value of the permissible maximum amplitude $ua_{max}$ 44.

In one embodiment, the amplification in the high frequency amplifier may be influenced.

From the time $t_2$ onwards, the current value of the continuously determined overload factor x(t) is again lower than "1," and the instruction voltage is emitted unchanged.

Since Max(x(t)) has exceeded the value "1," for the subsequent pulse with the instruction voltage 42, the permissible maximum amplitude $ua_{max}$ 44 is reduced to a new permissible maximum amplitude $ua_{max}$ 45. The instruction voltage $U_{AUF}$ 42 has a maximum amplitude $ua_2$, which is lower than the modified permissible maximum amplitude $ua_{max}$ 45. Therefore, the instruction voltage $ua_2$ remains unchanged, and no scaling is carried out. In the scenario depicted in FIG. 5, the voltage 43 in the high frequency amplifier remains below the limit that physically continues to apply to the maximum amplitude $ua_{max}$ 44, and the overload factor x(t) still remains lower than "1."

Like FIG. 5, FIG. 6 illustrates a voltage/time diagram, in which a voltage U is recorded across a time axis t. FIG. 6 once again illustrates a voltage curve 40 for an instruction voltage $U_{AUF}$ for a first pulse. FIG. 6 further illustrates a voltage curve 46 for an instruction voltage $U_{AUF}$ for a second pulse. For the first pulse, the same applies as was stated with reference to FIG. 5, and there are therefore no further explanations given. As in FIG. 5, a new permissible maximum amplitude $ua_{max}$ 45 is determined.

The instruction voltage $U_{AUF}$ 46, which is shown with a dotted line, has a maximum amplitude $ua_2$ that is lower than the maximum amplitude $ua_{max}$ 44, but greater than the reduced maximum amplitude $ua_{max}$ 45. If this pulse were to continue to be emitted unchanged, an overload situation and "clipping" would again occur (e.g., "clipping" of the pulse peaks as in the case of pulse 1). However, the maximum amplitude $ua_2$ is compared with the modified maximum amplitude $ua_{max}$ 45. Since the voltage $ua_2$ is greater than the reduced maximum amplitude $ua_{max}$ 45, the instruction voltage 46 is scaled. The new instruction voltage for the second pulse is shown with a continuous line 47. At a maximum amplitude, the actual voltage 48 in the high frequency amplifier reaches precisely the original maximum amplitude $ua_{max}$ 44, but does not exceed the original maximum amplitude $ua_{max}$ 44. Due to scaling to the reduced maximum amplitude, overload protection is achieved without there being any distortion of the pulse.

The method and the circuit arrangement may be incorporated in a magnetic resonance tomography system in conjunction with regulating of the high frequency pulses. This may lead to a malfunction in the control section such that the control section becomes unstable. Two embodiments that allow the intervention in the control section to be compensated for at another point such that the control section remains stable are described below with reference to FIGS. 7 and 8.

Figure 7:
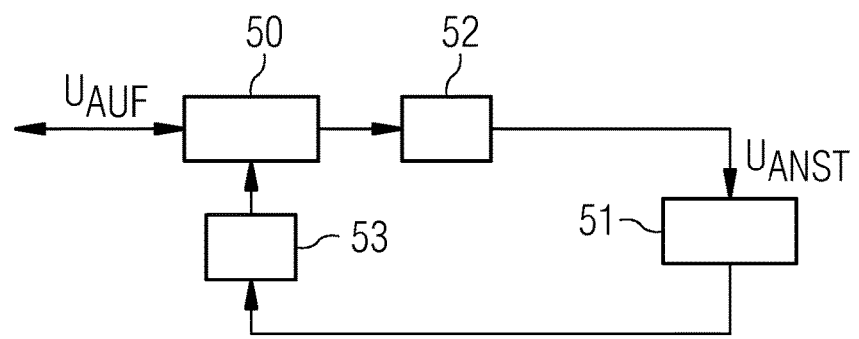
FIG. 7 is a schematic block diagram of an exemplary control loop including a first compensation option for reduction in an instruction signal.

FIG. 7 schematically illustrates a first control loop in the form of a block diagram. An instruction voltage $U_{AUF}$ is supplied to a controller 50. The instruction voltage $U_{AUF}$ transmits the regulated instruction signal to one embodiment of a circuit arrangement 52, in which scaling of the regulated instruction signal may be carried out, as already explained in detail in the aforementioned. A block 51 represents the entire high frequency section, which includes, for example, a high frequency amplifier and an antenna arrangement. A feedback signal is supplied to the controller 50 via an equalizing block 53.

If the instruction signal in the block 52 is reduced in order to avoid an overload, then the controller will try to counteract this reduction. This is the reason for providing the equalizing block 53, in which the reduction is again countermanded. In other words, if the instruction signal has been divided by the overload factor x(t) in block 52, then in the compensation block 53, the feedback signal is multiplied by the overload factor x(t). For the other embodiment, if the instruction signal has been multiplied by the scaling factor y(t) in block 52, then in the equalizing block 53, the feedback signal is divided by the scaling factor y(t). The controller does not therefore see the intervention to protect against overload and remains stable.

Figure 8:
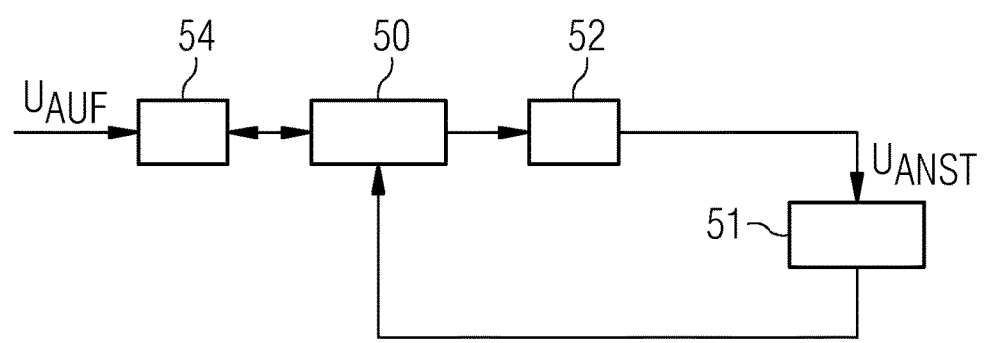
FIG. 8 is a schematic block diagram of an exemplary control loop including a second compensation option for the reduction in the instruction signal.

FIG. 8 illustrates a schematic view of a second control loop in a block diagram. An instruction voltage $U_{AUF}$ is supplied via an equalizing block 54 to a controller 50. The instruction voltage $U_{AUF}$ transmits the regulated instruction signal to a circuit arrangement 52, in which scaling of the regulated instruction signal is carried out where necessary. A block 51 again represents the entire high frequency section. A feedback signal is fed back to the controller 50.

As in FIG. 7, the feeding back of the signal that has been reduced for overload reasons leads to a destabilizing of the control loop. The destabilizing is a result of the feedback signal being compared with the instruction signal that has been supplied to the controller. The controller tries to equalize the low feedback signal by increasing the instruction signal. In the embodiment shown in FIG. 8, in the equalizing block 54, the instruction signal that has been supplied to the controller is reduced according to the reduction that took place in block 52. Thus, the controller is comparing two similarly reduced signals, and the regulating system remains stable.

The aforementioned method that has been described in detail and the circuit arrangements shown are merely exemplary embodiments that may be modified by a person skilled in the art in a variety of ways without going beyond the scope of the invention. The use of the indefinite article "a" or "an" does not provide that the features in question may not also occur in plural form. The terms "unit" and "module" do not preclude the components in question from including interacting partial components that may optionally also be spatially separated.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for emitting a sequence of high frequency pulses having different envelopes in a magnetic resonance tomography system, the method comprising:
   receiving a digital instruction signal that specifies an envelope for a high frequency pulse that is to be emitted;
   emitting a digital control signal to a high frequency unit for generating the high frequency pulse depending on the digital instruction signal;
   receiving a test signal that allows notification to be given of a current overload situation;
   calculating a standardized overload factor from the test signal, the calculating comprising dividing the test signal by a test value, wherein an overload occurs when the test signal exceeds the test value, such that a value of "1" is assigned to reaching of an overload limit; and
   reducing a current control signal when the test signal indicates the current overload situation, wherein the test signal indicates the current overload situation when the standardized overload factor exceeds the value of "1."

2. The method as claimed in claim 1, wherein the reduction in the current control signal is achieved such that a current digital instruction signal is divided by a current value for the standardized overload factor.

3. The method as claimed in claim 1, further comprising determining a maximum value for the standardized overload factor via at least a first pulse.

4. The method as claimed in claim 3, further comprising:
   determining a standardized maximum permissible instruction amplitude for a subsequent pulse, wherein the standardized maximum permissible instruction amplitude indicates a maximum voltage of an instruction voltage of the subsequent pulse; and
   reducing the standardized maximum permissible instruction amplitude when the maximum value for the standardized overload factor is greater than "1."

5. The method as claimed in claim 4, wherein the determining of the maximum permissible instruction amplitude comprises dividing the maximum permissible instruction amplitude by the maximum value for the standardized overload factor.

6. The method as claimed in claim 1, further comprising:
   storing scaling factors for specified overload factors in a table; and
   reducing a current instruction amplitude, the reducing of the current instruction amplitude comprising multiplying the current instruction amplitude for the current standardized overload factor by a scaling factor.

7. The method as claimed in claim 6, further comprising determining a minimum scaling factor via at least a first pulse.

8. The method as claimed in claim 7, further comprising:
   determining a standardized maximum permissible instruction amplitude for a subsequent pulse, wherein the standardized maximum permissible instruction amplitude indicates a maximum voltage of an instruction voltage of the subsequent pulse; and
   reducing the standardized maximum permissible instruction amplitude when the minimum scaling factor detected is lower than "1," wherein the detected minimum scaling factor is based on a current scaling factor corresponding to a current overload factor.

9. The method as claimed in claim 8, wherein the determining of the maximum permissible instruction amplitude comprises multiplying the maximum permissible instruction amplitude by the minimum scaling factor.

10. The method as claimed in claim 2, further comprising determining a maximum value for the standardized overload factor via at least a first pulse.

11. A method for regulating a high frequency signal in a magnetic resonance tomography system, the method comprising:
    emitting a sequence of high frequency pulses having different envelopes in a magnetic resonance tomography system, the emitting comprising:
       receiving a digital instruction signal that specifies an envelope for a high frequency pulse that is to be emitted;
       emitting a digital control signal to a high frequency unit for generating the high frequency pulse depending on the digital instruction signal;
       receiving a test signal that allows notification to be given of a current overload situation;
       calculating a standardized overload factor from the test signal, the calculating comprising dividing the test signal by a test value, wherein an overload occurs when the test signal exceeds the test value, such that a value of "1" is assigned to reaching of an overload limit; and
       reducing a current control signal when the test signal indicates the current overload situation, wherein the test signal indicates the current overload situation when the standardized overload factor exceeds the value of "1,"
    wherein a reduction in a maximum permissible instruction amplitude of a subsequent pulse in the sequence of high frequency pulses is compensated by increasing a feedback signal in a control loop of the magnetic resonance tomography system or by reducing a controller input signal in the control loop of the magnetic resonance tomography system, and wherein the maximum permissible instruction amplitude indicates a maximum voltage of an instruction voltage of the subsequent pulse.

12. The method as claimed in claim 11, further comprising wherein increasing the feedback signal in the control loop is in proportion to the reduction in the maximum permissible instruction amplitude.

13. The method as claimed in claim 11, wherein reducing the controller input signal is in proportion to the reduction in the maximum permissible instruction amplitude.

14. A circuit arrangement for emitting a sequence of high frequency pulses in a magnetic resonance tomography system, the circuit arrangement comprising:

a receiver unit operable to receive a digital instruction signal that specifies the envelope for the high frequency pulse to be emitted;

an output unit operable to output a digital control signal to a high frequency unit for the generation of the high frequency pulse depending on the digital instruction signal;

a test receiver operable to receive a test signal that allows notification of a current overload situation to be given;

a calculation unit operable to calculate a standardized overload factor from the test signal, the calculation comprising division of the test signal by a test value, wherein an overload occurs when the test signal exceeds the test value, such that a value of "1" is assigned to reaching of an overload limit; and a correction unit operable to reduce a current digital control signal when the test signal indicates an overload situation, wherein the test signal indicates the current overload situation when the standardized overload factor exceeds the value of "1."

15. A magnetic resonance tomography system comprising:

a circuit arrangement for emitting a sequence of high frequency pulses, the circuit arrangement comprising:

a receiver unit operable to receive a digital instruction signal that specifies the envelope for the high frequency pulse to be emitted;

an output unit operable to output a digital control signal to a high frequency unit for the generation of the high frequency pulse depending on the digital instruction signal;

a test receiver operable to receive a test signal that allows notification of a current overload situation to be given;

a calculation unit operable to calculate a standardized overload factor from the test signal, the calculation comprising division of the test signal by a test value, wherein an overload occurs when the test signal exceeds the test value, such that a value of "1" is assigned to reaching of an overload limit; and a correction unit operable to reduce a current digital control signal when the test signal indicates an overload situation, wherein the test signal indicates the current overload situation when the standardized overload factor exceeds the value of "1."

* * * * *